United States Patent
Oishi et al.

(10) Patent No.: US 10,050,587 B2
(45) Date of Patent: Aug. 14, 2018

(54) POWER AMPLIFIER CIRCUIT AND SEMICONDUCTOR INTEGRATED CIRCUIT

(71) Applicant: FUJITSU LIMITED, Kawasaki-shi, Kanagawa (JP)

(72) Inventors: Kazuaki Oishi, Yokohama (JP); Kouichi Kanda, Chofu (JP); Shiho Nakahara, Nerima (JP); Xiao-Yan Wang, Leuven (BE); Xiongchuan Huang, Leuven (BE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/446,821

(22) Filed: Mar. 1, 2017

(65) Prior Publication Data

US 2017/0179886 A1 Jun. 22, 2017

Related U.S. Application Data

(63) Continuation of application No. PCT/JP2014/073183, filed on Sep. 3, 2014.

(51) Int. Cl.
*H03F 1/02* (2006.01)
*H03F 3/24* (2006.01)
(Continued)

(52) U.S. Cl.
CPC .......... *H03F 1/0211* (2013.01); *H03F 3/195* (2013.01); *H03F 3/245* (2013.01);
(Continued)

(58) Field of Classification Search
CPC .. H03F 1/0222; H03F 2200/102; H03F 3/602; H03F 1/0288; H03F 3/211;
(Continued)

(56) References Cited

U.S. PATENT DOCUMENTS 7,170,341 B2 * 1/2007 Conrad ............. H03F 1/02
  330/296
7,952,433 B2 * 5/2011 An ..................... H03F 1/0266
  330/295

(Continued)

FOREIGN PATENT DOCUMENTS

JP   2006-238447 A    9/2006
WO   WO 2009/151097 A1   12/2009

OTHER PUBLICATIONS

International Search Report of related International Patent Application No. PCT/JP2014/073183 dated Sep. 30, 2014.

(Continued)

*Primary Examiner* — Khanh V Nguyen
(74) *Attorney, Agent, or Firm* — Arent Fox LLP

(57) ABSTRACT

A power amplifier circuit includes unit amplifiers (unit PAs) whose output terminals are connected to one another, among which a number of unit PAs to be operated is controlled by an amplitude signal indicative of an amplitude of an input signal, and which output output signals based on a phase signal indicative of a phase of the input signal and an output current controller which controls an output current of each of the unit PAs. Each unit PA includes a first transistor and a second transistor connected in series between the output terminal and a ground. The first transistor receives the phase signal at a gate. The second transistor receives at a gate a control signal generated by the output current controller and determines the output current flowing to the output terminal on the basis of the control signal.

9 Claims, 17 Drawing Sheets

(51) Int. Cl.
  *H03F 3/195* (2006.01)
  *H03F 3/68* (2006.01)
  *H03F 3/45* (2006.01)
  *H03F 1/22* (2006.01)
  *H03F 3/21* (2006.01)
  *H03F 3/60* (2006.01)

(52) U.S. Cl.
  CPC .......... *H03F 3/45179* (2013.01); *H03F 3/68* (2013.01); *H03F 1/0288* (2013.01); *H03F 1/22* (2013.01); *H03F 1/223* (2013.01); *H03F 3/211* (2013.01); *H03F 3/602* (2013.01); *H03F 2200/451* (2013.01); *H03F 2203/21196* (2013.01)

(58) Field of Classification Search
  CPC ..... H03F 1/07; H03F 3/68; H03F 1/22; H03F 1/223; H03F 2200/294; H03F 2200/372; H03G 3/20; H03G 3/3042
  USPC ............... 330/51, 124 R, 136, 261, 295, 311
  See application file for complete search history.

(56) References Cited

U.S. PATENT DOCUMENTS

| | | | |
|---|---|---|---|
| 9,294,056 B2* | 3/2016 | Nobbe | H03F 1/0261 |
| 9,660,598 B2* | 5/2017 | Olson | H03F 3/211 |
| 2005/0030104 A1* | 2/2005 | Chen | H03F 1/0277 330/295 |
| 2006/0202760 A1 | 9/2006 | Simon | |
| 2010/0266066 A1* | 10/2010 | Takahashi | H03G 3/004 375/295 |

OTHER PUBLICATIONS

Written Opinion of related International Patent Application No. PCT/JP2014/073183 dated Sep. 30, 2014. Partial Translation.

Notice of Reasons for Refusal of corresponding Japanese Patent Application No. 2016-546241 dated May 23, 2018.

* cited by examiner

POWER AMPLIFIER CIRCUIT AND SEMICONDUCTOR INTEGRATED CIRCUIT

CROSS-REFERENCE TO RELATED APPLICATION

This application is a continuation application of International Application PCT/JP2014/073183 filed on Sep. 3, 2014 which designated the U.S., the entire contents of which are incorporated herein by reference.

FIELD

The embodiment discussed herein is related to a power amplifier circuit and a semiconductor integrated circuit.

BACKGROUND

Power amplifier circuits are used in transmitters for radio communication in order to amplify a signal and transmit radio waves into the air.

A switched mode power amplifier circuit is known as a type of power amplifier circuit. Furthermore, a polar modulation-based switched mode power amplifier circuit is known as a type of switched mode power amplifier circuit. With a polar modulation-based switched mode power amplifier circuit, a modulated wave signal is separated into a phase signal and an amplitude signal. A power amplifier is driven by the phase signal and, for example, the number of unit amplifiers to be operated of a plurality of unit amplifiers is controlled by the amplitude signal. Because a switched mode power amplifier circuit operates as a switch, it is hardly subject to variations in the characteristics of elements. Furthermore, a switched mode power amplifier circuit operates stably even at a low power supply voltage. Therefore, a switched mode power amplifier circuit is suitable for a semiconductor integrated circuit fabricated by microfabrication processes.

See, for example, International Publication Pamphlet No. WO2009/151097.

By the way, with a power amplifier circuit in which the number of unit amplifiers to be operated of a plurality of unit amplifiers is controlled by an amplitude signal, the number of unit amplifiers to be controlled may be reduced by making a digital code of the amplitude signal small to decrease average output power. In that case, however, the signal to noise ratio (SNR) of the amplitude signal becomes low and the SNR of output power of the power amplifier circuit also becomes low. This makes it difficult to exercise power control with accuracy in a wide power range.

SUMMARY

According to an aspect, there is provided a power amplifier circuit including a plurality of unit amplifiers whose output terminals are connected to one another, among which a number of unit amplifiers to be operated is controlled by an amplitude signal indicative of an amplitude of an input signal, and which output output signals based on a phase signal indicative of a phase of the input signal and an output current controller which controls an output current of each of the plurality of unit amplifiers, each of the plurality of unit amplifiers including a first transistor and a second transistor connected in series between the output terminal and a ground, the first transistor receiving the phase signal at a first gate, the second transistor receiving at a second gate a control signal generated by the output current controller and determining the output current flowing to the output terminal on the basis of the control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Figure 1:
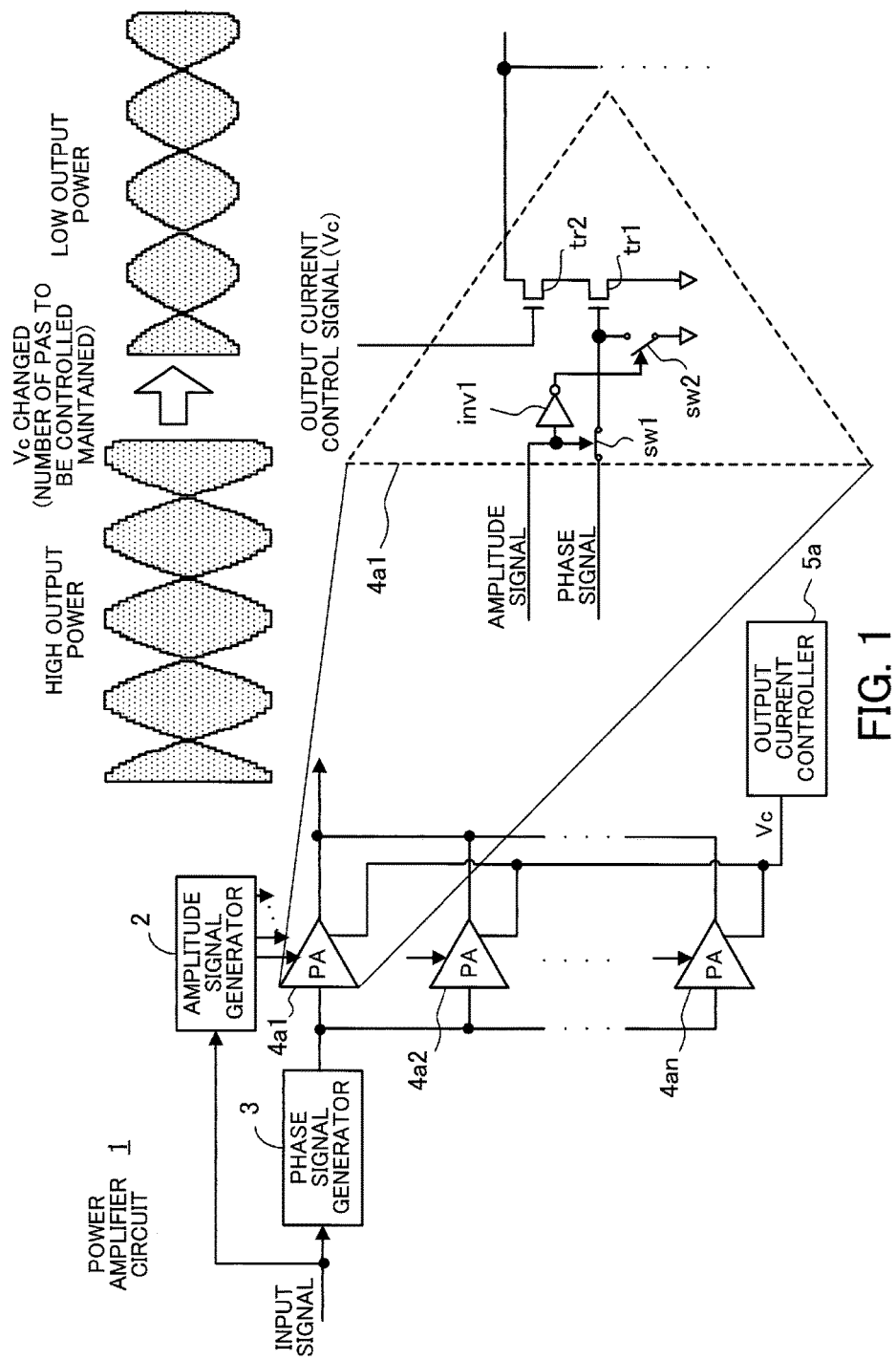
FIG. 1 illustrates an example of a power amplifier circuit.

An embodiment will now be described with reference to the accompanying drawings, wherein like reference numerals refer to like elements throughout.

FIG. 1 illustrates an example of a power amplifier circuit.

A power amplifier circuit 1 according to an embodiment performs power amplification with a polar modulation system.

The power amplifier circuit 1 includes an amplitude signal generator 2, a phase signal generator 3, unit amplifiers (hereinafter referred to as the unit PAs) 4a1, 4a2, . . . , and 4an, and an output current controller 5a.

The amplitude signal generator 2 receives an input signal and generates an amplitude signal indicative of the amplitude of the input signal.

The phase signal generator 3 receives the input signal and generates a phase signal indicative of the phase of the input signal.

Output terminals of the unit PAs 4a1 through 4an are connected to one another. The number of unit PAs to be operated is controlled by the amplitude signal. The unit PAs 4a1 through 4an output output signals based on the phase signal.

The output current controller 5a controls an output current of each of the unit PAs 4a1 through 4an.

FIG. 1 also illustrates an example of the unit PA 4a1. Each of the other unit PAs 4a2 through 4an also includes the same circuit (not illustrated).

The unit PA 4a1 includes transistors tr1 and tr2, an inverter circuit inv1, and switches sw1 and sw2.

In the example of FIG. 1, the transistors tr1 and tr2 are n-channel metal-oxide semiconductor field effect transistors (MOSFETs) and are connected in series between the output terminal of the unit PA 4a1 and ground (reference power supply terminal).

A gate of the transistor tr1 is connected to the phase signal generator 3 via the switch sw1. In addition, the gate of the transistor tr1 is connected to the ground via the switch sw2. A source of the transistor tr1 is connected to the ground and a drain of the transistor tr1 is connected to a source of the transistor tr2. A drain of the transistor tr2 is connected to the output terminal of the unit PA 4a1. Furthermore, the transistor tr2 receives an output current control signal (voltage Vc) at its gate and determines an output current flowing to the output terminal of the unit PA 4a1 on the basis of the output current control signal.

The switch sw1 is controlled by a value (1-bit digital value) of the amplitude signal generated by the amplitude signal generator 2. The switch sw2 is controlled by a control signal obtained by inverting the logical level of the amplitude signal by the inverter circuit inv1. For example, when a value of the amplitude signal is "1," the switch sw1 is on and the switch sw2 is off. The transistor tr1 is in an on or off state depending on a value of the phase signal. In this case, the unit PA 4a1 functions as an amplifier.

On the other hand, when a value of the amplitude signal is "0," the switch sw1 is off and the switch sw2 is on. The transistor tr1 is in an off state regardless of a value of the phase signal. In this case, the unit PA 4a1 does not operate (unit PA 4a1 does not function as an amplifier).

For example, the switches sw1 and sw2 are also realized by n-channel MOSFETs.

An example of the operation of the power amplifier circuit 1 according to the embodiment will now be described.

Figure 2:
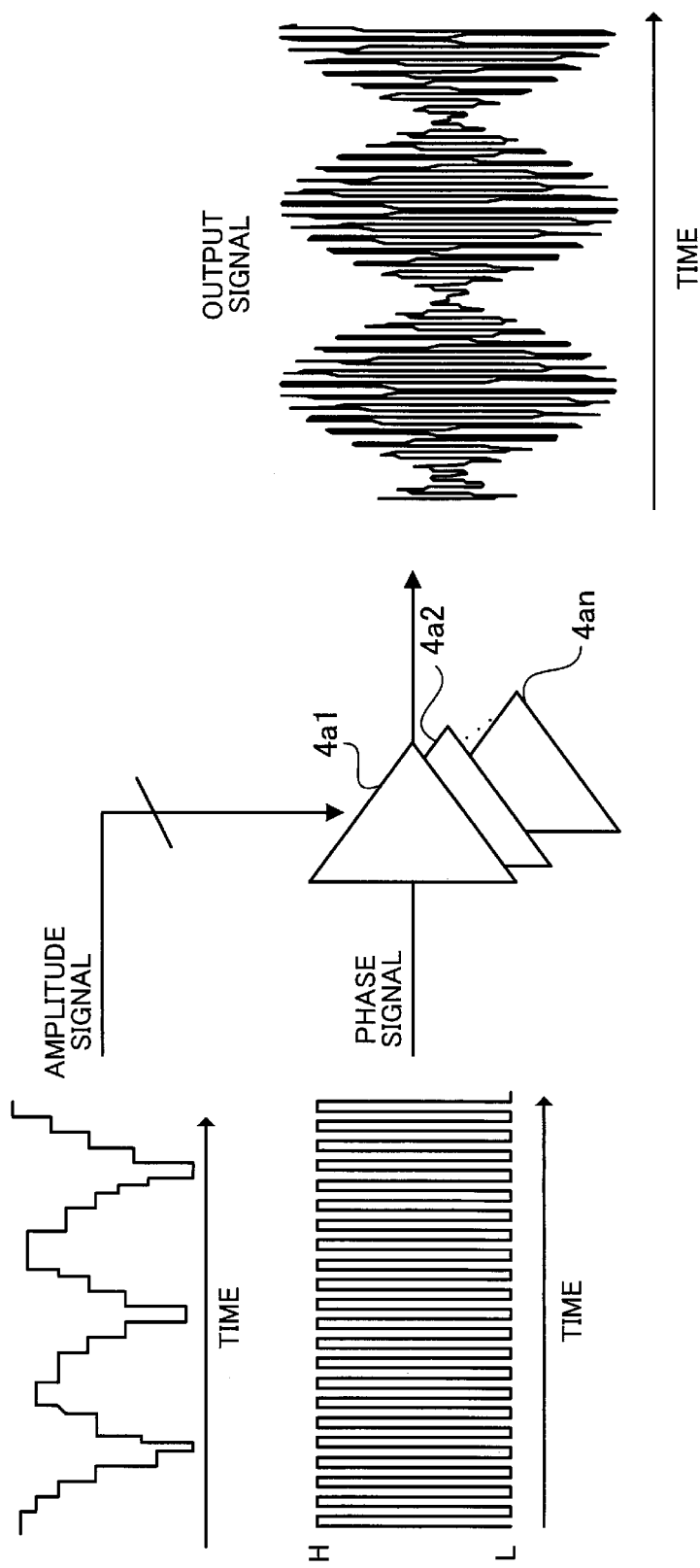
FIG. 2 illustrates examples of an amplitude signal, a phase signal and an output signal of the power amplifier circuit.

FIG. 2 illustrates examples of an amplitude signal, a phase signal and an output signal of the power amplifier circuit.

In FIG. 2, an example of each signal is illustrated on a time axis. An amplitude signal represents the amplitude of an input signal by a digital value. When a value of the amplitude signal is large, a large number of unit PAs are operated. When a value of the amplitude signal is small, a small number of unit PAs are operated. As a result, as illustrated in FIG. 2, an output signal whose amplitude changes is obtained from a phase signal which repeats transitions between a high (H) level value and a low (L) level value.

Operation performed in the case of output power of the above power amplifier circuit 1 being changed will now be described. First a case where output power is changed by changing the number of unit PAs to be controlled of the unit PAs 4a1 through 4an by an amplitude signal will be described as an example for comparison.

Figure 3:
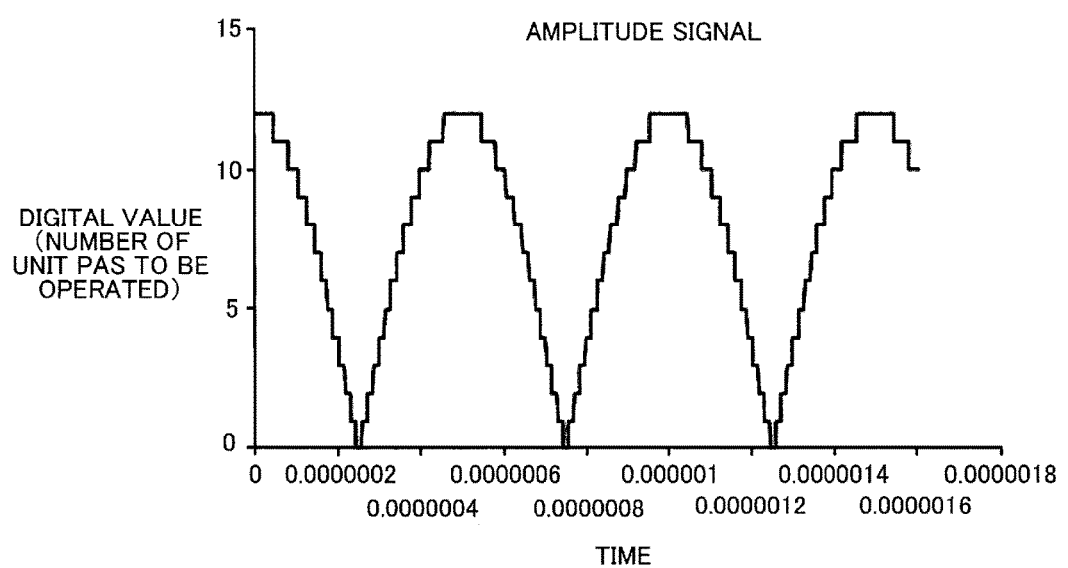
FIG. 3 illustrates an example of an amplitude signal.

FIG. 3 illustrates an example of an amplitude signal.

In FIG. 3, a horizontal axis indicates time and a vertical axis indicates a digital value.

In the example of FIG. 3, an amplitude signal having the digital values 0 to 12 is indicated. A digital value represents the number of unit PAs to be operated of the unit PAs 4a1 through 4an. If a digital value is 12, then the largest number of unit PAs are operated. For example, if the number n of the unit PAs 4a1 through 4an is 12, then all of the unit PAs 4a1 through 4a12 are operated. Conversely, if a digital value is 0, then none of the unit PAs 4a1 through 4an is operated.

Figure 4:
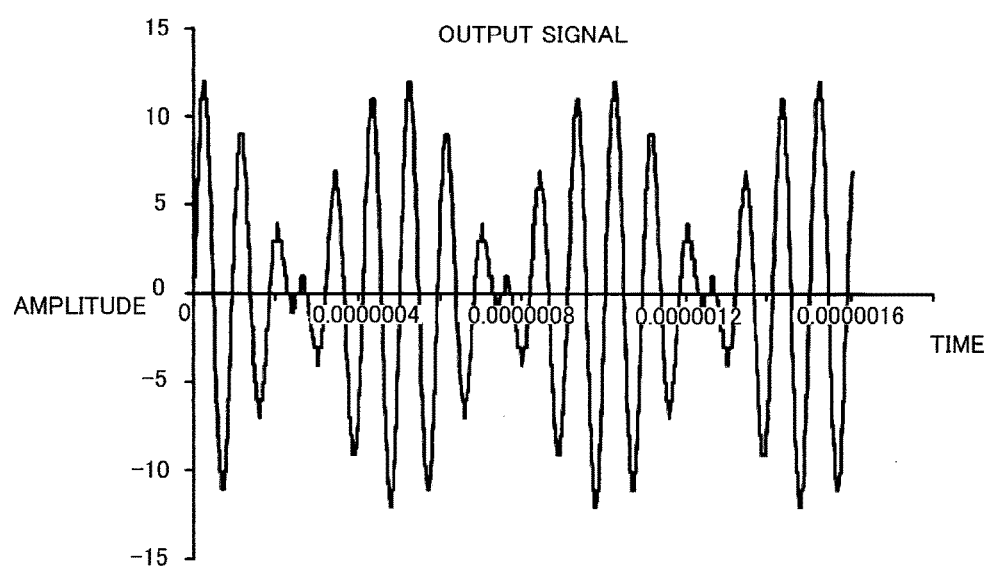
FIG. 4 illustrates an example of an output signal of the power amplifier circuit at the time of the amplitude signal of FIG. 3 being inputted.

FIG. 4 illustrates an example of an output signal of the power amplifier circuit at the time of the amplitude signal of FIG. 3 being inputted.

In FIG. 4, a horizontal axis indicates time and a vertical axis indicates amplitude.

An instantaneous amplitude of an output signal, which is a high-frequency signal, changes at 12 stages in each of a plus direction and a minus direction according to the amplitude signal illustrated in FIG. 3.

In order to make average output power low, the average number of unit PAs to be operated of the unit PAs 4a1 through 4an may be changed.

Figure 5:
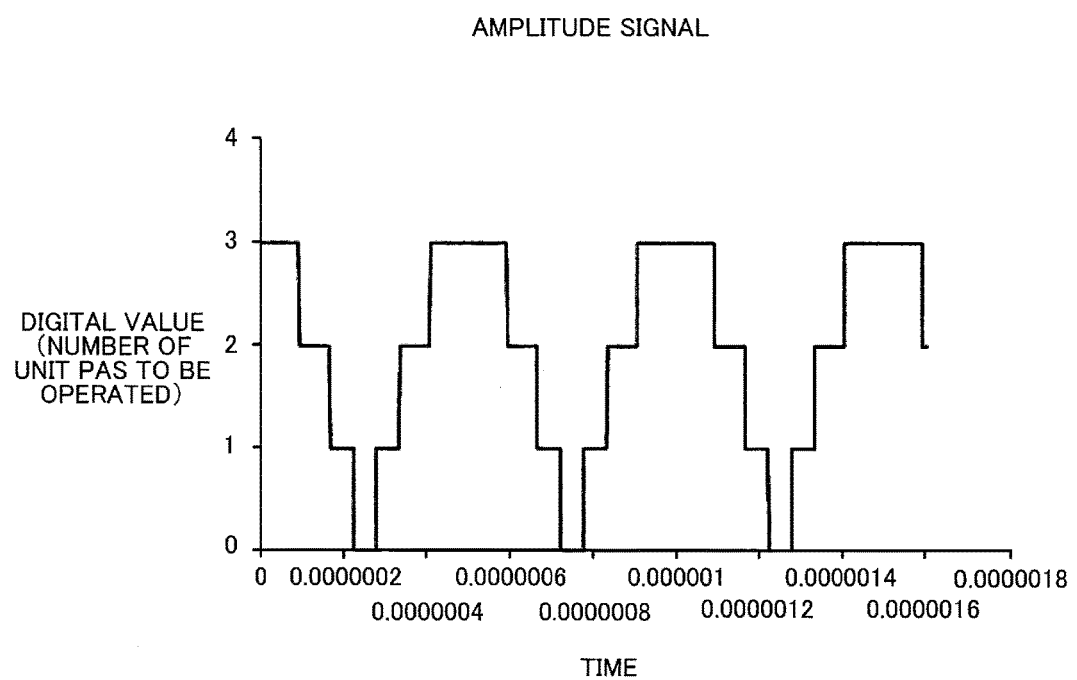
FIG. 5 illustrates another example of an amplitude signal.

FIG. 5 illustrates another example of an amplitude signal.

In FIG. 5, a horizontal axis indicates time and a vertical axis indicates a digital value.

In the example of FIG. 5, an amplitude signal having the digital values 0 to 3 is indicated. In this case, the number of unit PAs to be controlled (largest number of unit PAs to be operated) of the unit PAs 4a1 through 4an is 3.

However, the SNR of this amplitude signal is low and noise resistance is low.

Figure 6:
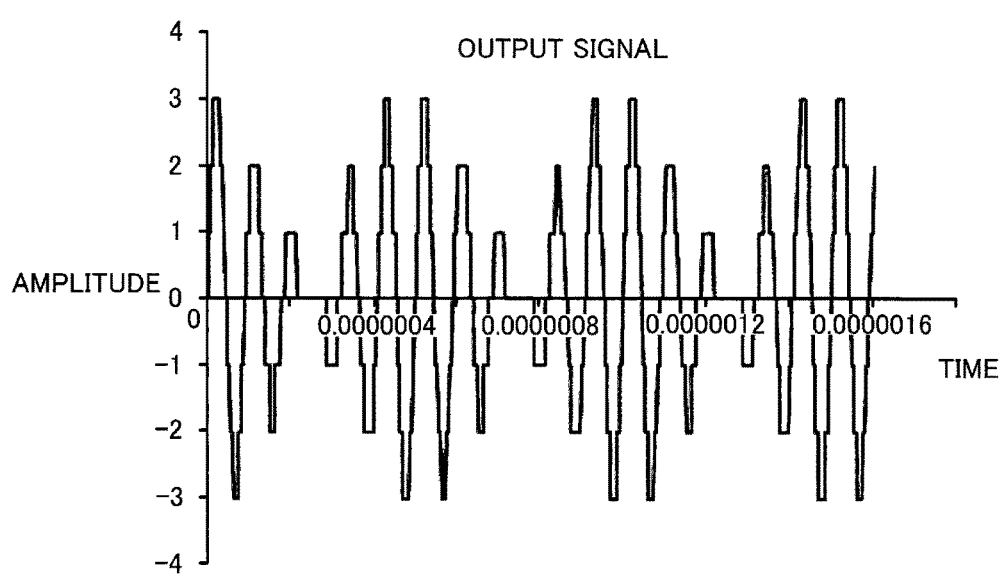
FIG. 6 illustrates an example of an output signal of the power amplifier circuit at the time of the amplitude signal of FIG. 5 being inputted.

FIG. 6 illustrates an example of an output signal of the power amplifier circuit at the time of the amplitude signal of FIG. 5 being inputted.

In FIG. 6, a horizontal axis indicates time and a vertical axis indicates amplitude.

An instantaneous amplitude of an output signal changes at 3 stages in each of a plus direction and a minus direction according to the amplitude signal illustrated in FIG. 5. The SNR of this output signal is also low and noise resistance is low.

Unlike the above method for adjusting output power, the power amplifier circuit 1 according to the embodiment controls an output current of each of the unit PAs 4a1 through 4an by an output current control signal (voltage Vc) without changing the number of unit PAs to be controlled of the unit PAs 4a1 through 4an. By doing so, output power is changed.

Figure 7:
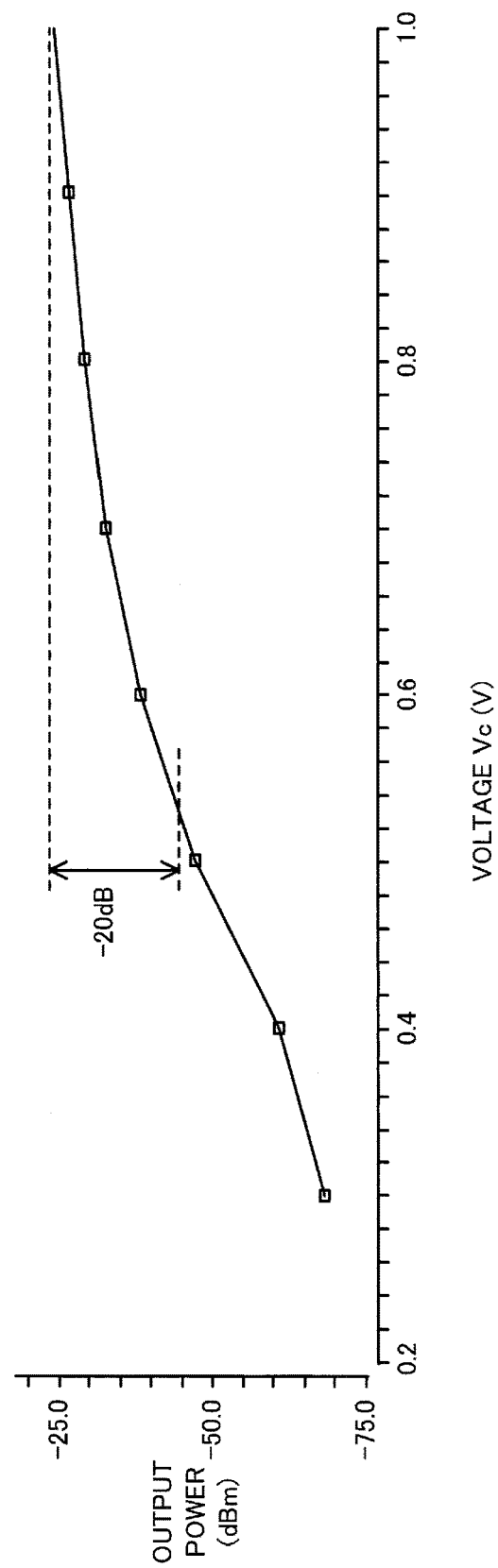
FIG. 7 illustrates an example of a simulation result indicative of the relationship between an output current control signal (voltage Vc) and output power.

FIG. 7 illustrates an example of a simulation result indicative of the relationship between an output current control signal (voltage Vc) and output power.

In FIG. 7, a horizontal axis indicates a voltage Vc (V) and a vertical axis indicates output power (dBm).

FIG. 7 indicates that, for example, a change in voltage Vc in the range of 0.5 to 1.0 V enables adjustment of output power in the range of −20 dB.

Therefore, as illustrated in FIG. 1, in order to reduce output power, the output current controller 5a decreases a voltage Vc. By doing so, an output current becomes small. This makes it possible to reduce output power while keeping the number of the unit PAs 4a1 through 4an to be controlled. As a result, even if output power is reduced, noise resistance is not degraded. Accordingly, power control is exercised with accuracy in a wide range.

The number of the unit PAs 4a1 through 4an to be controlled may vary. For example, when output power is reduced, the number of the unit PAs 4a1 through 4an to be controlled may be reduced until output power is reduced to a certain power. The number of the unit PAs 4a1 through 4an to be controlled may be kept for output power lower than the certain power. In that case, output power may be reduced by the above method.

An example of the output current controller 5a in the power amplifier circuit 1 according to the embodiment will now be described.

(Example of Output Current Controller 5a)

Figure 8:
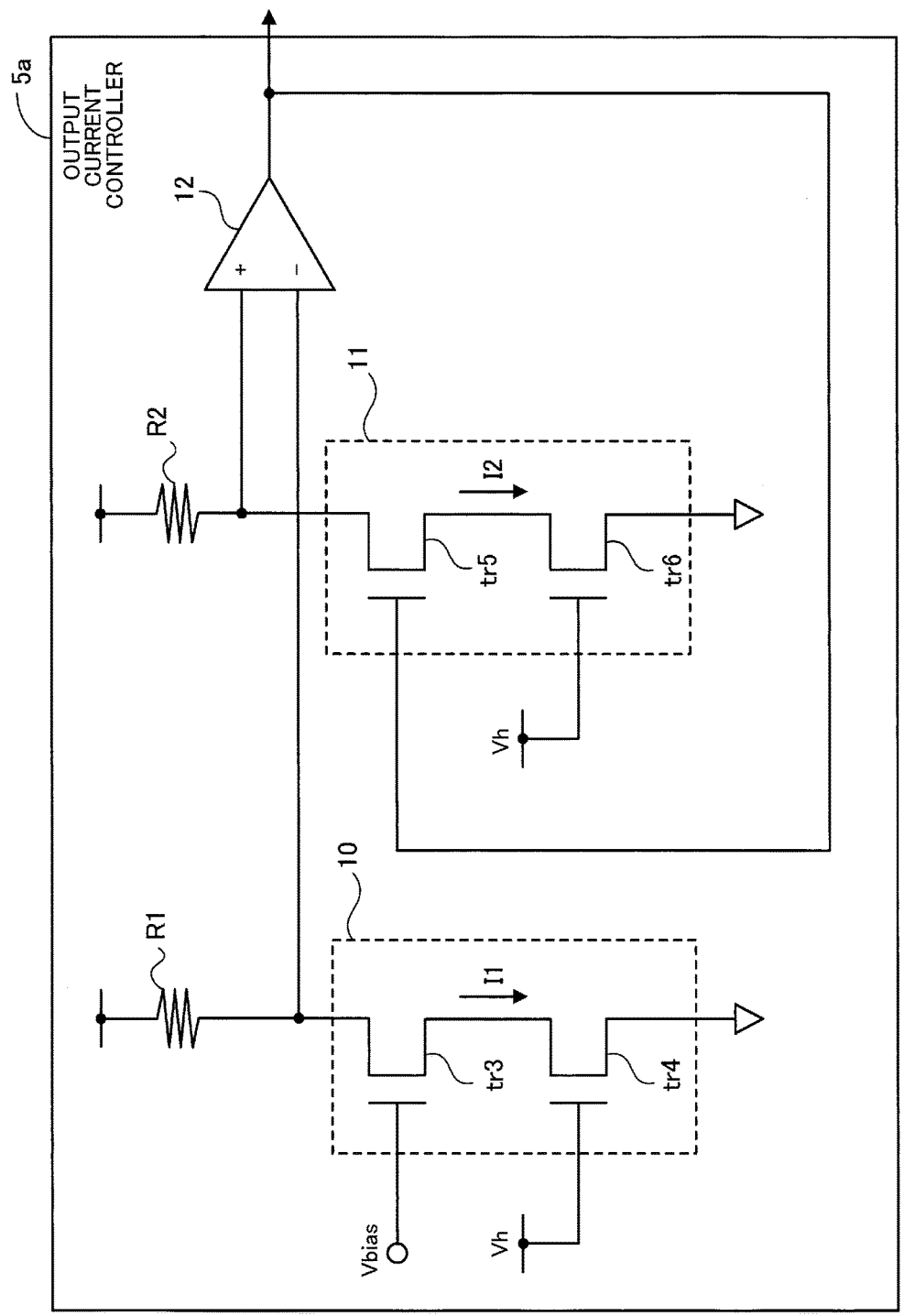
FIG. 8 illustrates an example of an output current controller.

FIG. 8 illustrates an example of the output current controller.

The output current controller 5a includes resistors R1 and R2, replica circuits 10 and 11 of a unit PA, and an operational amplifier 12.

The resistor R1 and the replica circuit 10 are connected in series between a power supply and ground.

A current I1 flows through the replica circuit 10.

The replica circuit 10 includes transistors tr3 and tr4 connected in series with the resistor R1. Hereinafter it is assumed that the transistors tr3 and tr4 are n-channel MOS-FETs as with the two transistors (transistors tr1 and tr2 illustrated in FIG. 1, for example) included in each of the unit PAs 4a1 through 4an illustrated in FIG. 1.

Furthermore, a drain of the transistor tr3 is connected to one end of the resistor R1 and an inverting input terminal (indicated by "−" in FIG. 8) of the operational amplifier 12. A bias voltage Vbias is applied to a gate of the transistor tr3 for putting the transistor tr3 into an on state. A source of the transistor tr3 is connected to a drain of the transistor tr4. An on-voltage (voltage for putting the transistor tr4 into an on state) Vh based on a voltage value (voltage value at an H level) of the above phase signal is applied to a gate of the transistor tr4.

The resistor R2 and the replica circuit 11 are connected in series between the power supply and the ground. This is the same with the resistor R1 and the replica circuit 10. Furthermore, a current I2 flows through the replica circuit 11 under control by the operational amplifier 12 described later. The magnitude of the current I2 is based on the ratio of the resistance value of the resistor R1 to the resistance value of the resistor R2 in relation to the current I1 flowing through the replica circuit 10.

The replica circuit 11 includes transistors tr5 and tr6 connected in series with the resistor R2. Hereinafter it is assumed that the transistors tr5 and tr6 are n-channel MOS-FETs as with the two transistors (transistors tr1 and tr2 illustrated in FIG. 1, for example) included in each of the unit PAs 4a1 through 4an illustrated in FIG. 1.

The transistor tr3 or tr5 corresponds to the transistor tr2 included in the unit PA 4a1 illustrated in FIG. 1 (same transistor included in each of the unit PAs 4a2 through 4an corresponds to the transistor tr3 or tr5). Furthermore, the transistor tr4 or tr6 corresponds to the transistor tr1 included in the unit PA 4a1 illustrated in FIG. 1 (same transistor included in each of the unit PAs 4a2 through 4an corresponds to the transistor tr4 or tr6). However, the transistor tr4 or tr6 may be equal in size to the transistor tr1. Alternatively, the size of the transistor tr4 or tr6 may be several times the size of the transistor tr1 or a fraction of the size of the transistor tr1. The transistor tr3 or tr5 may be equal in size to the transistor tr2. Alternatively, the size of the transistor tr1 or tr5 may be several times the size of the transistor tr2 or a fraction of the size of the transistor tr2.

Furthermore, a drain of the transistor tr5 is connected to one end of the resistor R2 and a non-inverting input terminal (indicated by "+" in FIG. 8) of the operational amplifier 12.

A gate of the transistor tr5 is connected to an output terminal of the operational amplifier 12 and a gate of a transistor (transistor tr2 in FIG. 1), of the two transistors in each of the unit PAs 4a1 through 4an, to which an output current control signal is inputted. A source of the transistor tr5 is connected to a drain of the transistor tr6. An on-voltage (voltage for putting the transistor tr6 into an on state) Vh based on a voltage value (voltage value at an H level) of the above phase signal is applied to a gate of the transistor tr6.

An operating voltage of the replica circuit 11 is approximately equal to an operating voltage of each of the unit PAs 4a1 through 4an. Therefore, if the transistor tr5 and the transistor tr6 are equal in size to the transistor tr2 and the transistor tr1 respectively, then an output current of each of the unit PAs 4a1 through 4an is equal in magnitude to the current I2. If the size of the transistor tr5 is several times the size of the transistor tr2 or a fraction of the size of the transistor tr2 and the size of the transistor tr6 is several times the size of the transistor tr1 or a fraction of the size of the transistor tr1, then the magnitude of an output current of each of the unit PAs 4a1 through 4an is a fraction of the magnitude of the current I2 or several times the magnitude of the current I2.

The operational amplifier 12 supplies a control signal to the replica circuit 11 for controlling the magnitude of the current I2 flowing through the replica circuit 11 so as to make a voltage across the resistor R1 equal to a voltage across the resistor R2. Furthermore, the operational amplifier 12 supplies the control signal to a gate of a transistor (transistor tr2 in the case of the unit PA 4a1 illustrated in FIG. 1) in each of the unit PAs 4a1 through 4an as the above output current control signal.

For example, it is assumed that in the above output current controller 5a the resistance value of the resistor R2 is A times the resistance value of the resistor R1. At this time the operational amplifier 12 exercises feedback control so as to make a voltage across the resistor R1 equal to a voltage across the resistor R2. Therefore, the magnitude of the current I2 flowing through the replica circuit 11 becomes 1/A times the magnitude of the current I1. As stated above, if the transistor tr5 and the transistor tr6 are equal in size to the transistor tr2 and the transistor tr1 respectively, then an output current of each of the unit PAs 4a1 through 4an is equal in magnitude to the current I2. Accordingly, the magnitude of an output current of each of the unit PAs 4a1 through 4an is 1/A times the magnitude of an output current of each of the unit PAs 4a1 through 4an obtained in the case of the resistor R1 and the resistor R2 being equal in resistance value. As a result, the magnitude of output power of the power amplifier circuit 1 also becomes 1/A times the magnitude of output power of the power amplifier circuit 1 obtained in the case of the resistor R1 and the resistor R2 being equal in resistance value.

That is to say, by changing the ratio of the resistance value of the resistor R1 to the resistance value of the resistor R2, output power is reduced. There is no need to reduce the number of the unit PAs 4a1 through 4an to be controlled by an amplitude signal. In addition, noise resistance is not degraded. Therefore, power control is exercised with accuracy in a comparatively wide power range.

Figure 9:
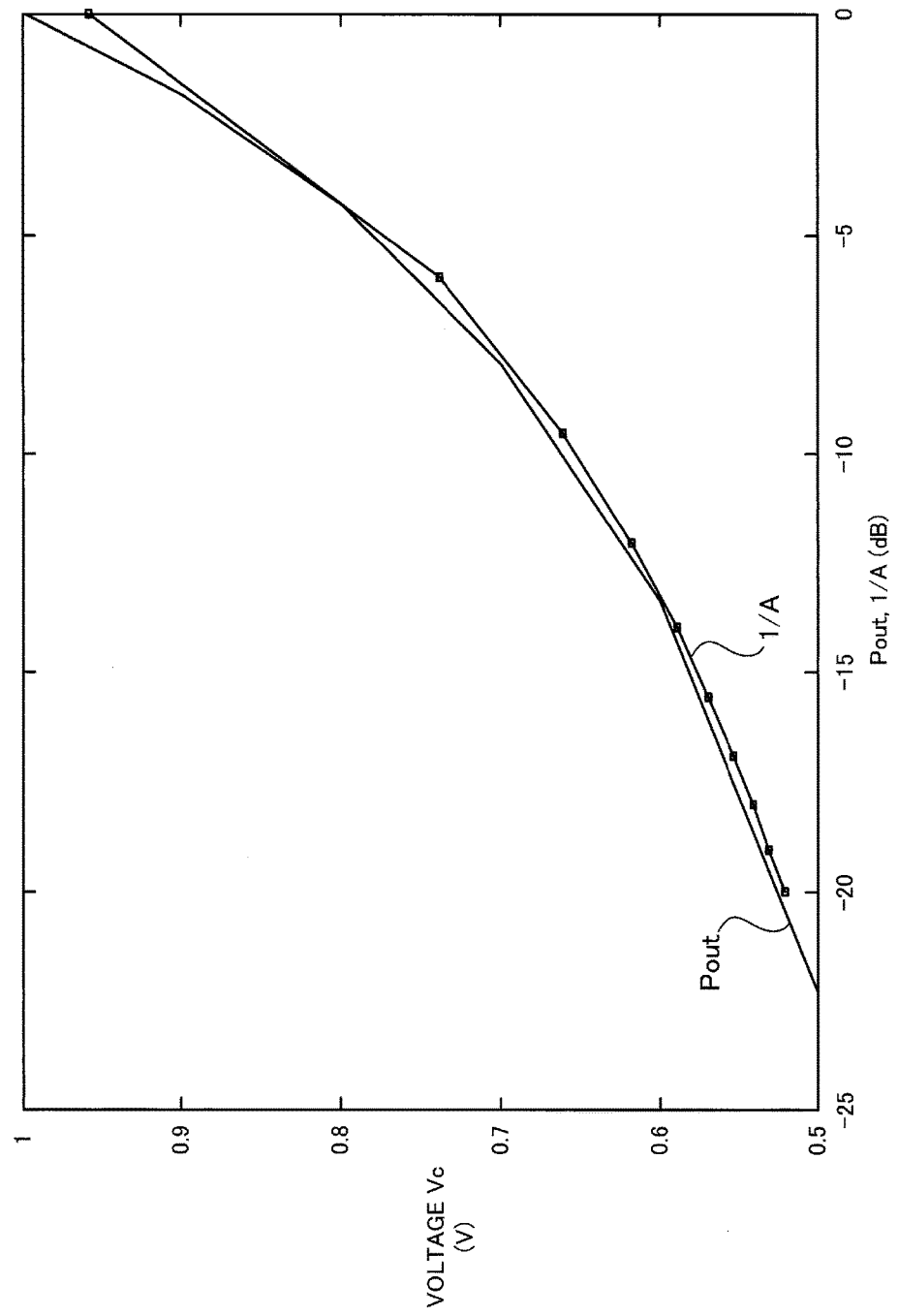
FIG. 9 illustrates an example of a simulation result indicative of the relationship between the ratio of the resistance value of a resistor R1 to the resistance value of a resistor R2, a voltage Vc which is an output current control signal, and output power.

FIG. 9 illustrates an example of a simulation result indicative of the relationship between the ratio of the resistance value of the resistor R1 to the resistance value of the resistor R2, a voltage Vc which is an output current control signal, and output power.

In FIG. 9, a horizontal axis indicates standardized output power Pout and the ratio 1/A of the resistance value of the resistor R1 to the resistance value of the resistor R2 (dB) and a vertical axis indicates a voltage Vc (V). Output power Pout is standardized so that when a voltage Vc is 1 (V), output power Pout will be 0 (dB).

As indicated in FIG. 9, there is a high correlation between a ratio 1/A and output power Pout.

For example, when the resistance value of the resistor R2 is 10 times the resistance value of the resistor R1, that is to say, when ratio 1/A=1/10 (−20 dB), a voltage Vc is 0.52 V. When a voltage Vc is 0.52 V, output power of the power amplifier circuit 1 is −20 dB which is equal to the ratio 1/A. That is to say, output power of the power amplifier circuit 1 is attenuated by 20 dB compared with a case where a voltage Vc is 1 V.

A variable resistor may be used as the resistor R2.

Figure 10:
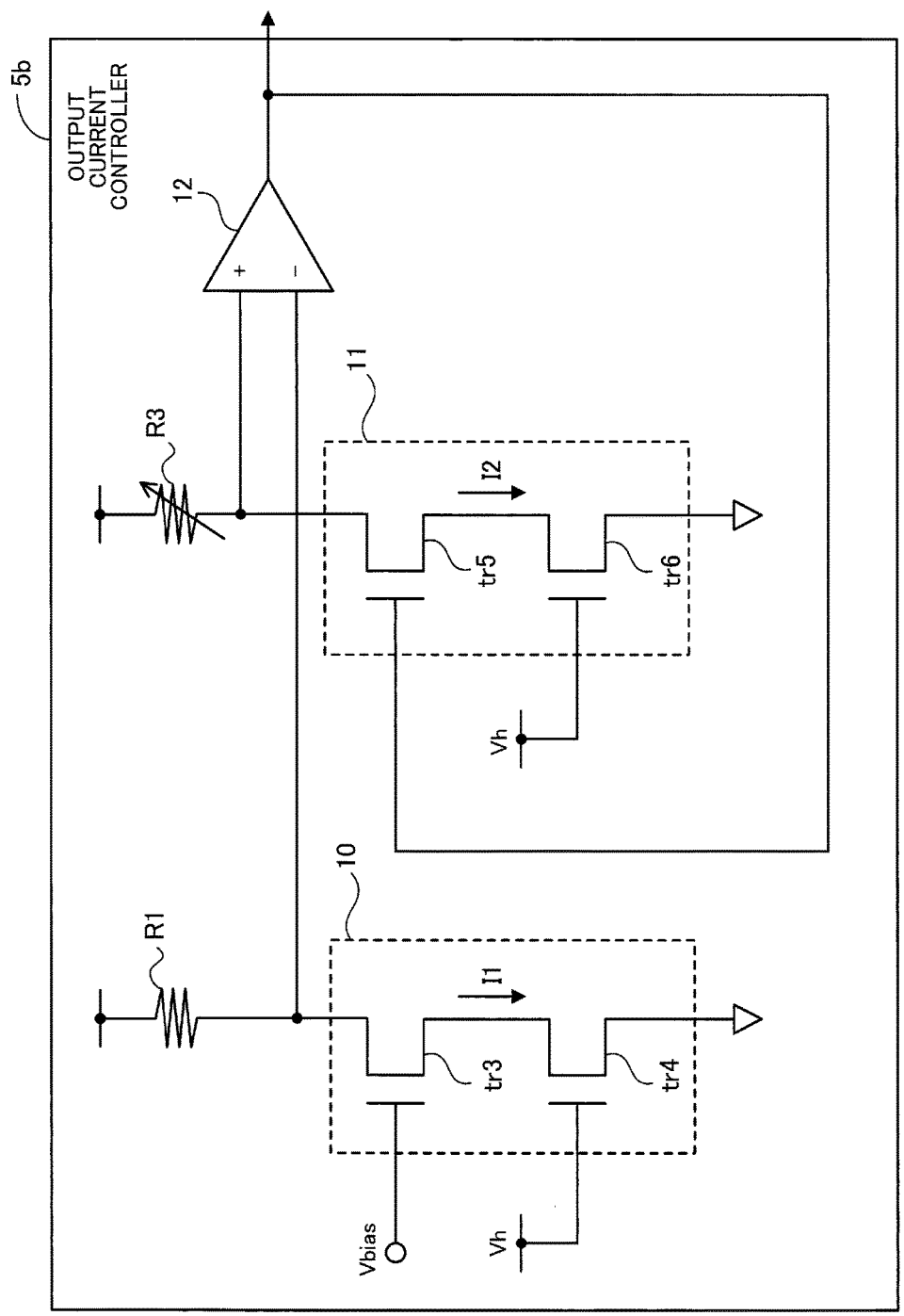
FIG. 10 illustrates an example of an output current controller using a variable resistor.

FIG. 10 illustrates an example of an output current controller using a variable resistor.

Components in FIG. 10 which are the same as those of the output current controller 5a illustrated in FIG. 8 are marked with the same numerals.

An output current controller 5b illustrated in FIG. 10 includes a variable resistor R3 in place of the resistor R2 included in the output current controller 5a illustrated in FIG. 8. The resistance value of the variable resistor R3 is controlled by a controller (not illustrated). For example, in order to decrease output power of a power amplifier circuit including the output current controller 5b, control is exercised so as to increase the resistance value of the variable resistor R3. In order to increase output power of the power amplifier circuit including the output current controller 5b, control is exercised so as to decrease the resistance value of the variable resistor R3.

By using the output current controller 5b illustrated in FIG. 10, the ratio of the resistance value of a resistor R1 to the resistance value of the variable resistor R3 is changed to a desired value. Accordingly, output power is adjusted with accuracy according to a user's wishes.

By the way, with the above output current controller 5a an arbitrary bias voltage Vbias is applied to the gate of the transistor tr3 of the replica circuit 10. This is the same with the above output current controller 5b. However, a bias voltage may be generated by the following replica circuit.

Figure 11:
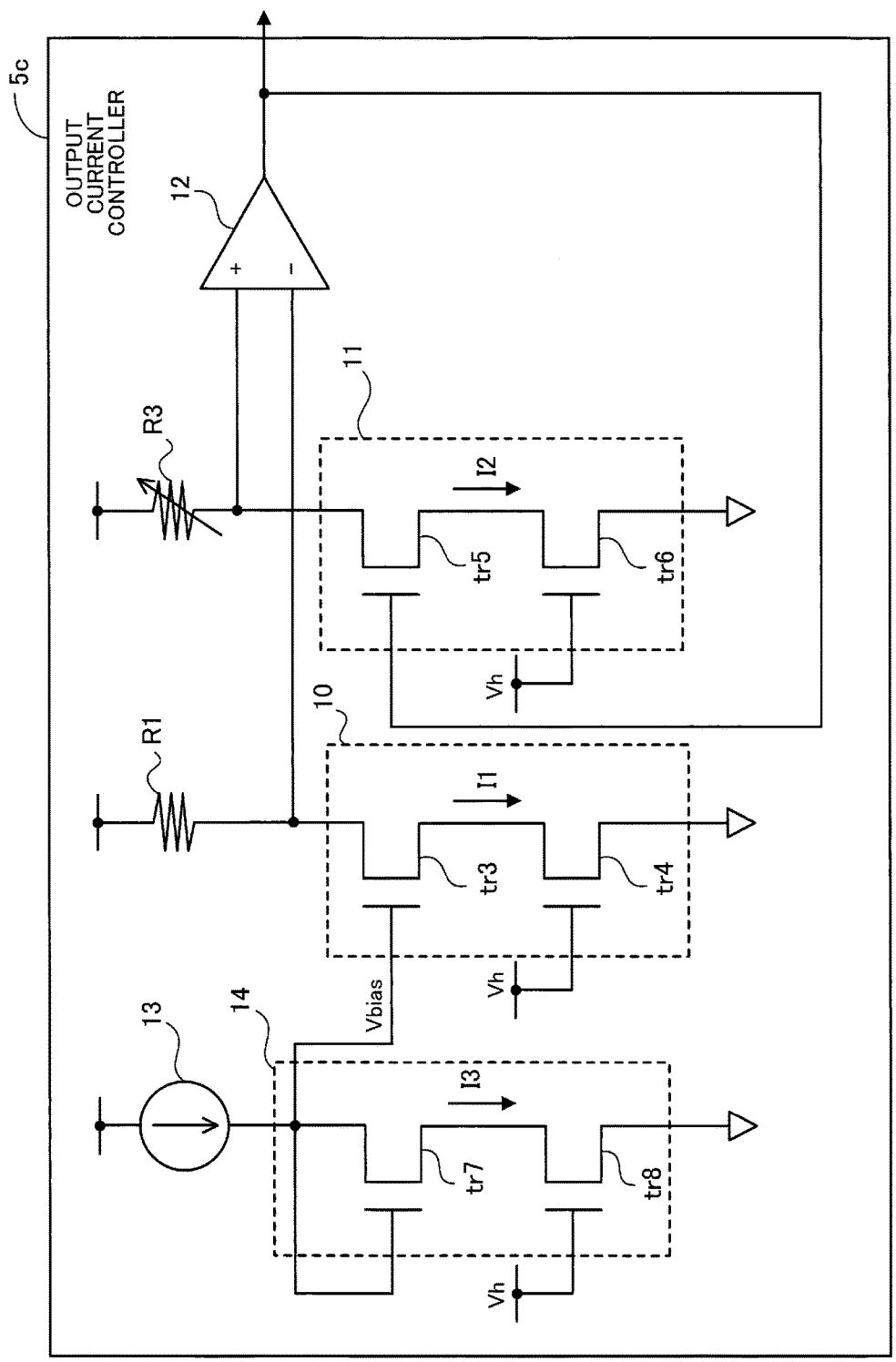
FIG. 11 illustrates an example of an output current controller including a replica circuit which generates a bias voltage by the use of a constant-current source.

FIG. 11 illustrates an example of an output current controller including a replica circuit which generates a bias voltage by the use of a constant-current source.

Components in FIG. 11 which are the same as those of the output current controller 5b illustrated in FIG. 10 are marked with the same numerals.

An output current controller 5c illustrated in FIG. 11 includes a constant-current source 13 connected to a power supply and a replica circuit 14 in addition to the components of the output current controller 5b illustrated in FIG. 10. The replica circuit 14 includes a transistor tr7 and a transistor tr8 connected in series between the constant-current source 13 and ground.

In the example of FIG. 11, the transistors tr7 and tr8 are n-channel MOSFETs as with the two transistors (transistors tr1 and tr2 illustrated in FIG. 1, for example) included in each of the unit PAs 4a1 through 4an illustrated in FIG. 1. The transistor tr7 and the transistor tr8 may be equal in size to the transistor tr2 and the transistor tr1, respectively, illustrated in FIG. 1. Alternatively, the size of the transistor tr7 may be several times the size of the transistor tr2 illustrated in FIG. 1 or a fraction of the size of the transistor tr2 illustrated in FIG. 1. The size of the transistor tr8 may be several times the size of the transistor tr1 illustrated in FIG. 1 or a fraction of the size of the transistor tr1 illustrated in FIG. 1.

Furthermore, a drain of the transistor tr7 is connected to a gate of the transistor tr7, the constant-current source 13, and a gate of a transistor tr3 of a replica circuit 10. A source of the transistor tr7 is connected to a drain of the transistor tr8. An on-voltage (voltage for putting the transistor tr8 into an on state) Vh based on a voltage value (voltage value at an H level) of the above phase signal is applied to a gate of the transistor tr8.

With the above output current controller 5c a value of a current I3 flowing through the replica circuit 14 becomes stable by the constant-current source 13. The current flowing through the replica circuit 14 and a current flowing through the replica circuit 10 are linked. Therefore, for example, if the transistor tr3 and the transistor tr4 are equal in size to the transistor tr7 and the transistor tr8 respectively, then a current I1 is equal to the current I3 and a value of the current I1 is stable.

With the above output current controller 5c a value of the current I1 is kept stable by the above function even if a threshold of the transistor tr3 changes due to manufacturing variation, a change in environmental temperature, or the like. A current I2 is found from the stable current I1 on the basis of the ratio of the resistance value of a resistor R1 to the resistance value of a variable resistor R3. As a result, a value of an output current of each of unit PAs 4a1 through 4an is also stable regardless of manufacturing variation, a change in environmental temperature, or the like.

The transistor tr8 may be omitted from the output current controller 5c illustrated in FIG. 11.

Figure 12:
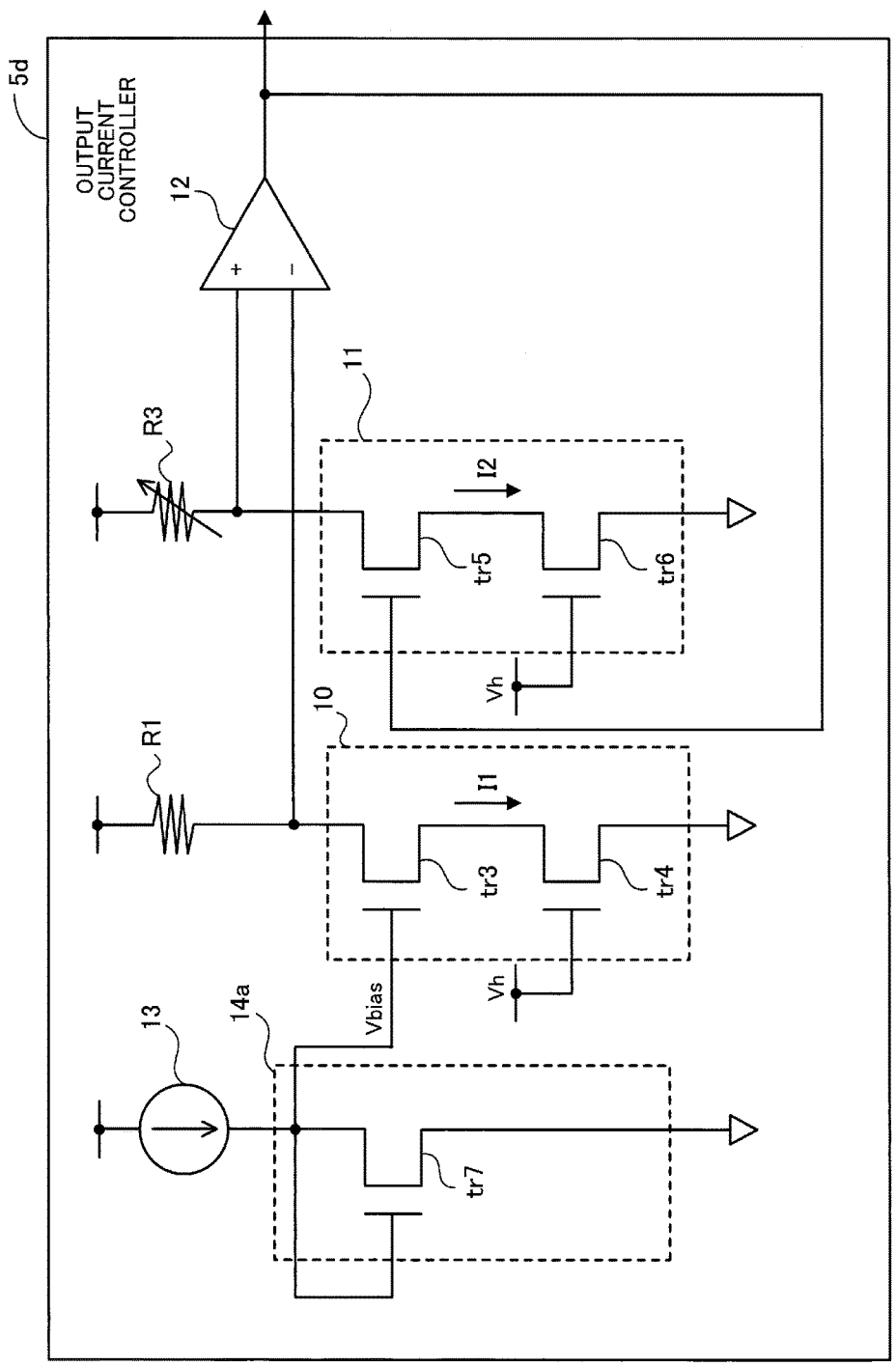
FIG. 12 illustrates another example of an output current controller including a replica circuit which generates a bias voltage by the use of a constant-current source.

FIG. 12 illustrates another example of an output current controller including a replica circuit which generates a bias voltage by the use of a constant-current source.

Components in FIG. 12 which are the same as those of the output current controller 5c illustrated in FIG. 11 are marked with the same numerals.

With an output current controller 5d illustrated in FIG. 12, a replica circuit 14a connected to a constant-current source 13 includes a transistor tr7. This is the same with the replica circuit 14 of the output current controller 5c illustrated in FIG. 11. However, the replica circuit 14a does not include a transistor tr8. That is to say, a source of the transistor tr7 is connected directly to ground.

By using the output current controller 5d, the same effect that is obtained by the use of the output current controller 5c is achieved. However, the accuracy is somewhat low compared with a case where the output current controller 5c is used. Furthermore, circuit scale is small compared with a case where the output current controller 5c is used.

Similarly, the transistor tr4 and the transistor tr6 may be omitted from the replica circuit 10 and the replica circuit 11, respectively.

Figure 13:
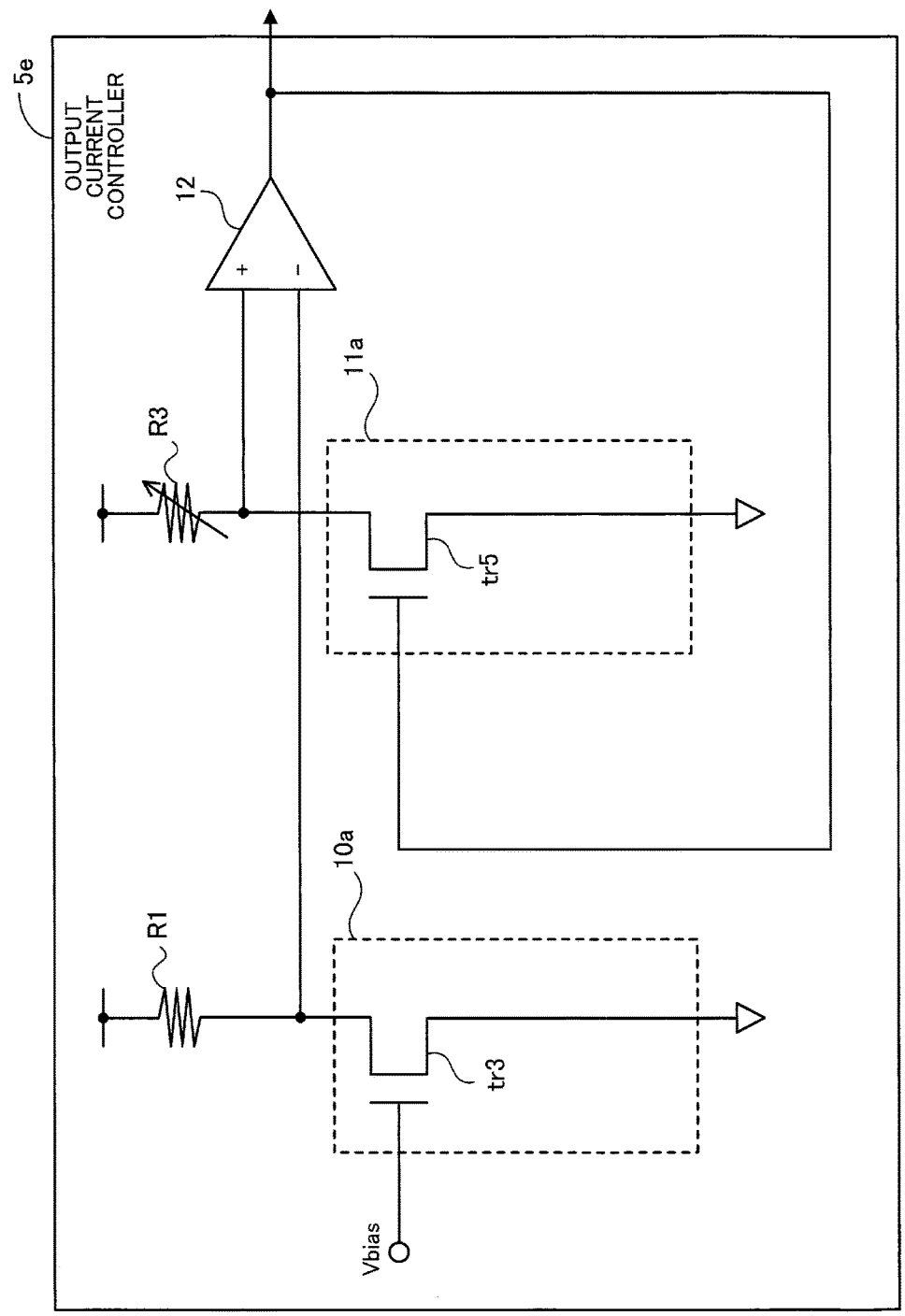
FIG. 13 illustrates an example of an output current controller in which each replica circuit is simplified.

FIG. 13 illustrates an example of an output current controller in which each replica circuit is simplified.

Components in FIG. 13 which are the same as those of the output current controller 5b illustrated in FIG. 10 are marked with the same numerals.

With an output current controller 5e illustrated in FIG. 13, replica circuits 10a and 11a include transistors tr3 and tr5 respectively. This is the same with the replica circuits 10 and 11 of the output current controller 5b illustrated in FIG. 10. However, the replica circuits 10a and 11a do not include transistors tr4 and tr6 respectively. That is to say, sources of the transistors tr3 and tr5 are connected directly to ground.

By using the output current controller 5e, the same effect that is obtained by the use of the output current controller 5b is achieved. However, the accuracy is somewhat low compared with a case where the output current controller 5b is used. Furthermore, circuit scale is small compared with a case where the output current controller 5b is used.

The constant-current source 13 and the replica circuit 14 or 14a illustrated in FIG. 11 or 12 may be connected to a gate of the transistor tr3 of the replica circuit 10a of the output current controller 5e.

Furthermore, in the above examples a change in the resistance value of the resistor R2 or the variable resistor R3 causes a change in the current I2. By doing so, an output current of each of the unit PAs 4a1 through 4an is adjusted and output power is changed. However, the current I2 (current I4 in the following example) may be changed in the following way.

Figure 14:
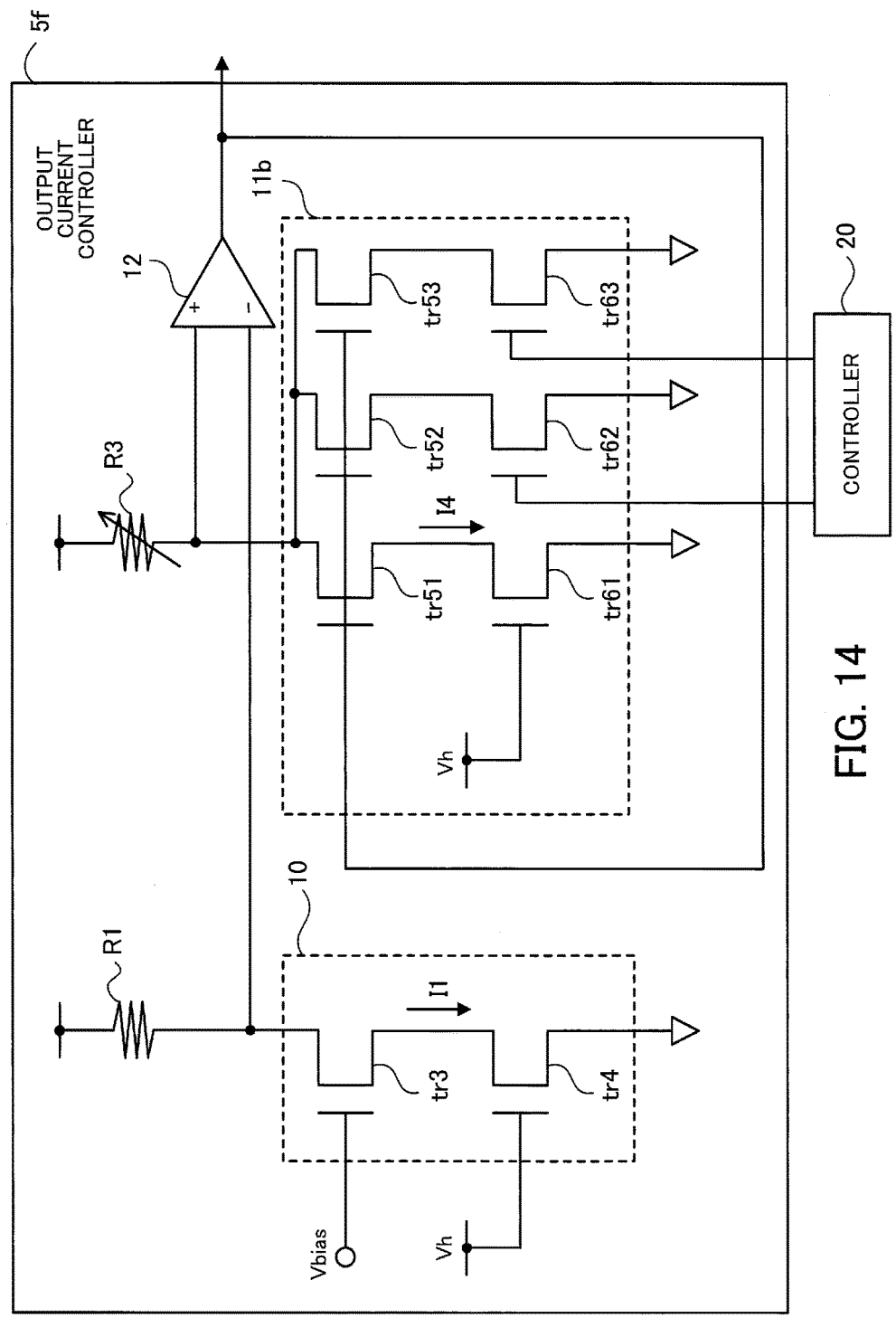
FIG. 14 illustrates an example of an output current controller having the function of coarsely adjusting an output current.

FIG. 14 illustrates an example of an output current controller having the function of coarsely adjusting an output current.

Components in FIG. 14 which are the same as those of the output current controller 5b illustrated in FIG. 10 are marked with the same numerals.

In the replica circuit 11 of the output current controller 5b illustrated in FIG. 10, the number of a transistor tr5 which receives a control signal is one and the number of a transistor tr6 connected in series with the transistor tr5 is one. On the other hand, a replica circuit 11b of an output current controller 5f illustrated in FIG. 14 includes transistors tr51, tr52, and tr53 which receive a control signal and transistors tr61, tr62, and tr63 connected in series with the transistors tr51, tr52, and tr53 respectively. The number of the transistors tr51, tr52, and tr53 and the number of the transistors tr61, tr62, and tr63 may be two or more.

Drains of the transistors tr51 through tr53 are connected to one end of a variable resistor R3 and a non-inverting input terminal (indicated by "+" in FIG. 14) of an operational amplifier 12. Gates of the transistors tr51 through tr53 are connected to an output terminal of the operational amplifier 12 and a gate of a transistor (transistor tr2 in FIG. 1), of the two transistors in each of the unit PAs 4a1 through 4an, to which an output current control signal is inputted. Sources of the transistors tr51 through tr53 are connected to drains of the transistors tr61 through tr63 respectively.

An on-voltage (voltage for putting the transistor tr61 into an on state) Vh based on a voltage value (voltage value at an H level) of the above phase signal is applied to a gate of the transistor tr61. A switching signal for performing switching between the on states and off states of the transistors tr62 and tr63 is inputted from a controller 20 to gates of the transistors tr62 and tr63. Furthermore, sources of the transistors tr61 through tr63 are connected to ground.

With the above output current controller 5f a value of a current I4 flowing through the replica circuit 11b (and an output current of each of the unit PAs 4a1 through 4an) is changed comparatively coarsely on the basis of whether the transistor tr62 or tr63 is put into an on state or an off state. As stated above, a coarse adjustment of a value of the current I4 is made on the basis of whether the transistor tr62 or tr63 is put into an on state or an off state. A fine adjustment of a value of the current I4 is made by controlling the resistance value of the variable resistor R3. The controller 20 may control the resistance value of the variable resistor R3.

By doing so, output power of the power amplifier circuit including the output current controller 5f is adjusted comparatively coarsely.

A circuit included in each of the unit PAs 4a1 through 4an is not limited to that illustrated in FIG. 1. Modifications of each of the unit PAs 4a1 through 4an will now be described.

Figure 15:
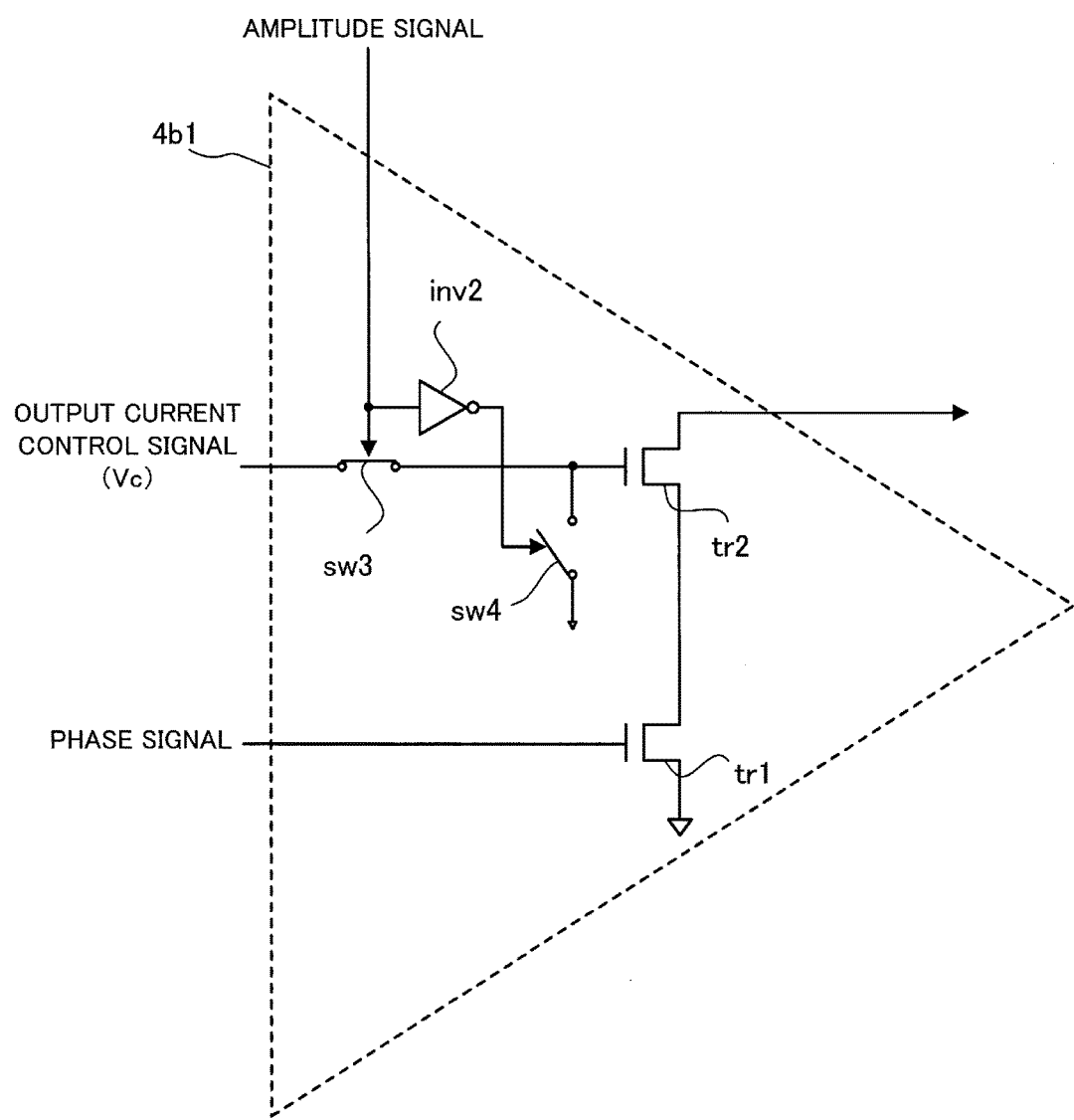
FIG. 15 illustrates a first modification of a unit PA.

FIG. 15 illustrates a first modification of a unit PA.

In the example of the unit PA 4a1 illustrated in FIG. 1, whether or not the unit PA 4a1 is operated is controlled on the basis of whether the transistor tr1 is put into an off state by the amplitude signal regardless of the phase signal. However, another method may be adopted. With a unit PA 4b1 illustrated in FIG. 15, whether or not the unit PA 4b1 is operated is controlled on the basis of whether a transistor tr2 is put into an off state by an amplitude signal regardless of an output current control signal (voltage Vc).

The output current control signal is inputted to a gate of the transistor tr2 via a switch sw3. Furthermore, the gate of the transistor tr2 is connected to ground via a switch sw4.

The switch sw3 is controlled by a value (1-bit digital value) of the amplitude signal. The switch sw4 is controlled by a control signal obtained by inverting the logical level of the amplitude signal by an inverter circuit inv2. For example, when a value of the amplitude signal is "1," the switch sw3 is on and the switch sw4 is off. The transistor tr2 is in an on or off state depending on a value of the output current control signal. In this case, the unit PA 4b1 functions as an amplifier.

On the other hand, when a value of the amplitude signal is "0," the switch sw3 is off and the switch sw4 is on. The transistor tr2 is in an off state regardless of a value of the output current control signal. In this case, the unit PA 4b1 does not operate (unit PA 4b1 does not function as an amplifier).

A transistor tr1 receives a phase signal at its gate. When a value of the phase signal is at an H level, the transistor tr1 is in an on state. When a value of the phase signal is at an L level, the transistor tr1 is in an off state.

Figure 16:
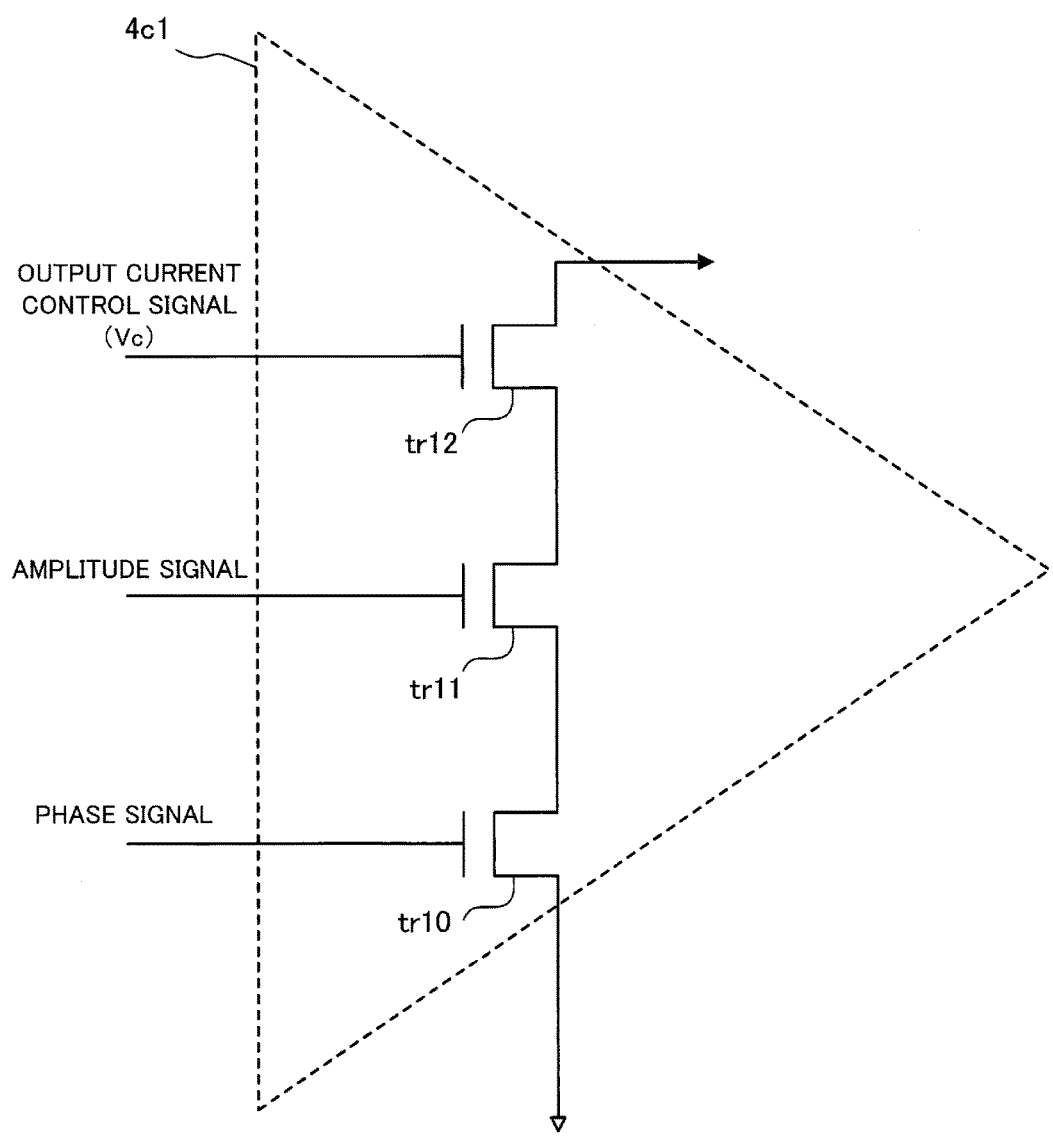
FIG. 16 illustrates a second modification of a unit PA.

FIG. 16 illustrates a second modification of a unit PA.

A unit PA 4c1 includes three transistors tr10, tr11, and tr12 connected in series between an output terminal of the unit PA 4c1 and ground. In the example of FIG. 16, the transistors tr10 through tr12 are n-channel MOSFETs.

A phase signal is inputted to a gate of the transistor tr10, an amplitude signal is inputted to a gate of the transistor tr11, and an output current control signal is inputted to a gate of the transistor tr12.

With the above unit PA 4c1, when a value of the amplitude signal is "0," the transistor tr11 is in an off state. An output current does not flow to the output terminal of the unit PA 4c1 regardless of the output current control signal or the phase signal and the unit PA 4c1 does not operate (unit PA 4c1 does not function as an amplifier).

When a value of the amplitude signal is "1," the transistor tr11 is in an on state and an output current whose magnitude corresponds to the output current control signal flows.

Each of the output current control signal, the amplitude signal, and the phase signal may be inputted to a gate of any of the transistors tr10 through tr12. For example, the output current control signal, the phase signal, and the amplitude signal may be inputted to the gates of the transistors tr10 through tr12 respectively.

(Example of Application of Power Amplifier Circuit)

The power amplifier circuit which has been described is applicable to, for example, a semiconductor integrated circuit in a radio communication device.

Figure 17:
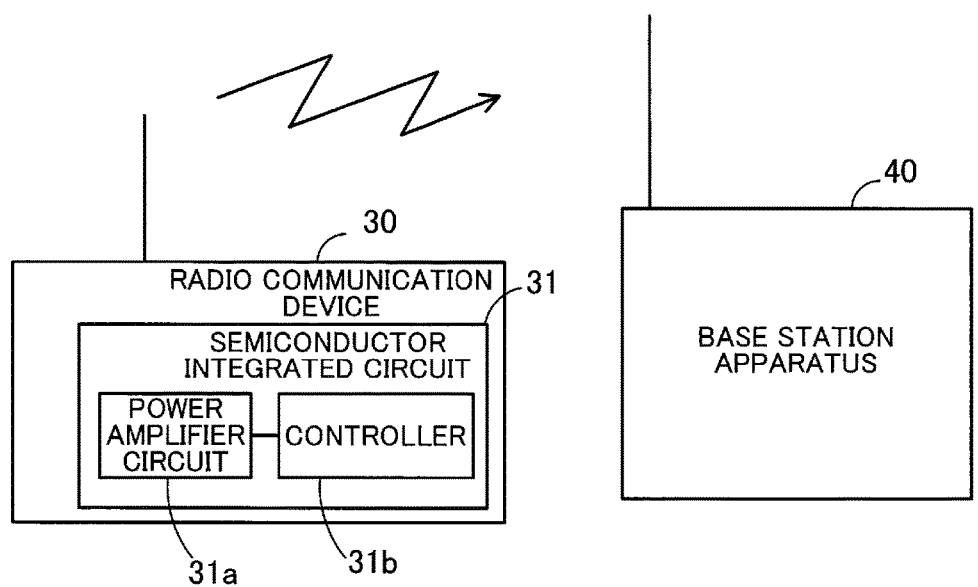
FIG. 17 illustrates an example of application of the power amplifier circuit.

FIG. 17 illustrates an example of application of the power amplifier circuit.

FIG. 17 illustrates a state in which radio communication is performed between a radio communication device 30, which is a terminal device, and a base station apparatus 40.

The radio communication device 30 includes a semiconductor integrated circuit 31. The semiconductor integrated circuit 31 includes a power amplifier circuit 31a and a controller 31b.

The power amplifier circuit 1 illustrated in FIG. 1 is applicable as the power amplifier circuit 31a. One of the output current controllers 5b through 5f illustrated in FIGS. 10 through 14, respectively, or a combination of them may be used in place of the output current controller 5a (FIG. 8) included in the power amplifier circuit 1.

The controller 31b gives an output current controller instructions to decrease or increase output power. For example, if the output current controller 5b illustrated in FIG. 10 is used, then the controller 31b controls the variable resistor R3 so as to increase the resistance value of the variable resistor R3 for decreasing output power. On the other hand, the controller 31b controls the variable resistor R3 so as to decrease the resistance value of the variable resistor R3 for increasing output power. If the output current controller 5f illustrated in FIG. 14 is used, then the controller 31b performs the function of the above controller 20 to control on-off of the transistor tr62 or tr63.

Furthermore, the controller 31b has the function of changing, for example, the communication characteristics (such as a radio frequency, a channel bandwidth, a modulation system, and a data rate) of the radio communication device 30.

The above radio communication device 30 is used in a short-range radio communication network (also referred to as, for example, a body area network) used for medical treatment, healthcare, or the like. IEEE (Institute of Electrical and Electronics Engineers) 802.15.6, which is a radio standard for body area networks, permits the use of comparatively high power (−16 dBm) as transmission power. However, IEEE 802.15.6 permits only a bandwidth of 300 kHz per channel. As a result, a data rate is low.

On the other hand, extremely low power radio stations and the like for which no license is needed are prescribed by Association of Radio Industries and Businesses (ARIB). Transmission power permitted as these extremely low power radio stations and the like is about several ten dBm and is low. However, a large bandwidth (2.4 MHz, for example) is utilized for each channel. Therefore, radio communication is performed at a high data rate (at 3.6 Mbps, for example).

The power amplifier circuit 31a as which the power amplifier circuit according to the embodiment is applied is hardly subject to noise even in a low power range and adjustment is made with accuracy. Accordingly, the power amplifier circuit 31a is suitable for such an extremely low power radio station. The controller 31b may make the power amplifier circuit 31a change output power according to communication distance to change transmission power.

According to the disclosed power amplifier circuit and semiconductor integrated circuit, power control is exercised with accuracy in a wide range.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power amplifier circuit comprising:
a plurality of unit amplifiers whose output terminals are connected to one another, among which a number of unit amplifiers to be operated is controlled by an amplitude signal indicative of an amplitude of an input signal, and which output signals based on a phase signal indicative of a phase of the input signal; and
an output current controller which controls an output current of each of the plurality of unit amplifiers,
wherein:
each of the plurality of unit amplifiers includes a first transistor and a second transistor connected in series between the output terminal and a ground;
the first transistor receives the phase signal at a first gate;
the second transistor receives at a second gate a control signal generated by the output current controller and determines the output current flowing to the output terminal on the basis of the control signal, and
the output current controller includes:
a first resistor and a first circuit connected in series between a power supply and the ground, a first current flowing through the first circuit;
a second resistor and a second circuit connected in series between the power supply and the ground, a second current whose magnitude is based on a ratio of a resistance value of the first resistor to a resistance value of the second resistor in relation to the first current flowing through the second circuit; and
an operation amplifier which compares a voltage across the first resistor with a voltage across the second resistor supplies the control signal to the second circuit for controlling the magnitude of the second current so as to make the voltage across the first resistor and the voltage across the second resistor equal, and supplies the control signal to the second gate.

2. The power amplifier circuit according to claim 1, wherein:
the first circuit includes a third transistor and a fourth transistor connected in series with the first resistor;
the second circuit includes a fifth transistor and a sixth transistor connected in series with the second resistor;
a bias voltage is applied to a third gate of the third transistor;
the control signal is supplied to a fifth gate of the fifth transistor; and
a first on-voltage based on a voltage value of the phase signal is applied to a fourth gate of the fourth transistor and a sixth gate of the sixth transistor.

3. The power amplifier circuit according to claim 2, wherein:
the output current controller includes a third circuit including a seventh transistor and an eighth transistor connected in series between a current source and the ground; and
a seventh gate of the seventh transistor is connected to the current source and the third gate and the first on-voltage is applied to an eighth gate of the eighth transistor.

4. The power amplifier circuit according to claim 1, wherein:
the first circuit includes a third transistor connected in series the first resistor;
the second circuit includes a fifth transistor connected in series with the second resistor;

a bias voltage is applied to a third gate of the third transistor; and the control signal is supplied to a fifth gate of the fifth transistor.

5. The power amplifier circuit according to claim 2, wherein:

the output current controller includes a third circuit including a seventh transistor connected between a current source and the ground; and a seventh gate of the seventh transistor is connected to the current source and the third gate.

6. The power amplifier circuit according to claim 2, wherein:

each of the fifth transistor and the sixth transistor is included in plurality; and a switching signal for performing switching between an on state and an off state of the sixth transistor is inputted to at least one of the sixth gates of the sixth transistors in place of the first on-voltage.

7. The power amplifier circuit according to claim 1, wherein the second resistor is a variable resistor.

8. The power amplifier circuit according to claim 1 further comprising:

an amplitude signal generator which generates the amplitude signal from the input signal; and a phase signal generator which generates the phase signal from the input signal, wherein the power amplifier circuit performs power amplification with a polar modulation system.

9. A semiconductor integrated circuit comprising:

a power amplifier circuit including:

a plurality of unit amplifiers whose output terminals are connected to one another, among which a number of unit amplifiers to be operated is controlled by an amplitude signal indicative of an amplitude of an input signal, and which output output signals based on a phase signal indicative of a phase of the input signal; and an output current controller which controls an output current of each of the plurality of unit amplifiers, each of the plurality of unit amplifiers including a first transistor and a second transistor connected in series between the output terminal and a ground, the first transistor receiving the phase signal at a first gate, and the second transistor receiving at a second gate a control signal generated by the output current controller and determining the output current flowing to the output terminal on the basis of the control signal; and a controller which gives the output current controller instructions to decrease or increase the output current, wherein the output current controller generates the control signal based on the instructions from the controller, and the output current controller includes:

a first resistor and a first circuit connected in series between a power supply and the ground, a first current flowing through the first circuit;

a second resistor and a second circuit connected in series between the power supply and the ground, a second current whose magnitude is based on a ratio of a resistance value of the first resistor to a resistance value of the second resistor in relation to the first current flowing through the second circuit; and an operation amplifier which compares a voltage across the first resistor with a voltage across the second resistor, supplies the control signal to the second circuit for controlling the magnitude of the second current so as to make the voltage across the first resistor and the voltage across the second resistor equal, and supplies the control signal to the second gate.

* * * * *